United States Patent
Oka et al.

(10) Patent No.: US 10,709,016 B2
(45) Date of Patent: Jul. 7, 2020

(54) FLEXIBLE PRINTED CIRCUIT BOARD

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Yoshio Oka, Osaka (JP); Yoshifumi Uchita, Shiga (JP); Yoshiro Adachi, Shiga (JP)

(73) Assignees: SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 0 days.

(21) Appl. No.: 16/621,448

(22) PCT Filed: Apr. 26, 2018

(86) PCT No.: PCT/JP2018/016915
§ 371 (c)(1),
(2) Date: Dec. 11, 2019

(87) PCT Pub. No.: WO2019/035248
PCT Pub. Date: Feb. 21, 2019

(65) Prior Publication Data
US 2020/0113046 A1 Apr. 9, 2020

(30) Foreign Application Priority Data
Aug. 14, 2017 (JP) .................. 2017-156510

(51) Int. Cl.
*H05K 1/02* (2006.01)
*H01R 12/65* (2011.01)
*H05K 1/11* (2006.01)

(52) U.S. Cl.
CPC .......... *H05K 1/0281* (2013.01); *H01R 12/65* (2013.01); *H05K 1/118* (2013.01); *H05K 2201/09145* (2013.01)

(58) Field of Classification Search
CPC ................. H05K 1/0281; H05K 1/118; H05K 2201/09781; H05K 2203/1572;
(Continued)

(56) References Cited

U.S. PATENT DOCUMENTS 4,756,940 A * 7/1988 Payne .................. H05K 1/0281
428/78
5,309,316 A * 5/1994 Yagi ...................... H05K 1/118
361/749
(Continued)

FOREIGN PATENT DOCUMENTS

| JP | S62-042482 | 2/1987 |
| JP | S63-036075 U | 3/1988 |
| WO | 2010/004439 | 1/2010 |

*Primary Examiner* — Steven T Sawyer
(74) *Attorney, Agent, or Firm* — IPUSA, PLLC

(57) ABSTRACT

A flexible printed circuit board according to one aspect of the present invention includes a base film having an insulating property and a conductive pattern laminated on one surface of the base film, and has a terminal connecting area toward one end edge of the conductive pattern, the flexible printed circuit board including a reinforcement member laminated on another surface of the base film and situated at least at a position opposite the terminal connecting area, wherein a shape of an end edge of the reinforcement member on the same side as an opposite end edge of the conductive pattern includes a periodic form constituted by curved lines.

3 Claims, 2 Drawing Sheets

(58) Field of Classification Search
CPC ......... H05K 3/325; H05K 2201/09709; H05K 2201/094; H05K 1/117; H05K 3/281; H05K 2201/09145; H01R 12/65
See application file for complete search history.

(56) References Cited

U.S. PATENT DOCUMENTS

| | | | | |
|---|---|---|---|---|
| 5,483,021 | A * | 1/1996 | Saen | H01B 7/0018 174/117 FF |
| 6,552,272 | B1 * | 4/2003 | Sheng | H02G 11/006 174/117 FF |
| 8,128,429 | B2 | 3/2012 | Suzuki | |
| 2004/0248437 | A1 * | 12/2004 | Wong | H05K 3/3405 439/79 |
| 2007/0068698 | A1 * | 3/2007 | Suekuni | H01R 12/592 174/117 F |
| 2009/0014204 | A1 * | 1/2009 | Wang | H05K 1/0281 174/254 |
| 2012/0099282 | A1 * | 4/2012 | Hasegawa | G06F 1/1658 361/749 |
| 2014/0342598 | A1 * | 11/2014 | Sagayama | H01R 12/78 439/494 |

* cited by examiner

FLEXIBLE PRINTED CIRCUIT BOARD

TECHNICAL FIELD

The present invention relates to a flexible printed circuit board. The present application claims priority to Japanese patent application No. 2017-156510 filed on Aug. 14, 2017, and the entire contents of the Japanese patent application are hereby incorporated by reference.

BACKGROUND ART

In recent years, various flexible printed circuit boards have been used in the field of electronic devices due to the need for size reduction and weight reduction of electronic devices. As such flexible printed circuit boards, a flexible printed circuit board is generally used that includes a base film serving as a base and a conductive pattern made of copper foil or the like laminated on the surface of the base film.

Such a flexible printed circuit board is flexible. For this reason, the connection terminals of a flexible printed circuit board for connecting to a conductor pattern of an electronic device have a reinforcement plate that serves as a reinforcement member and that is laminated on an outer face thereof, for example, for the purpose of preventing bending or warpage (see WO 2010/004439).

RELATED-ART DOCUMENTS

Patent Document

[Patent Document 1] International Publication Pamphlet No. WO2010/004439

SUMMARY OF THE INVENTION

Means to Solve the Problem

A flexible printed circuit board according to one aspect of the present invention includes a base film having an insulating property and a conductive pattern laminated on one surface of the base film, and has a terminal connecting area toward one end edge of the conductive pattern, the flexible printed circuit board including a reinforcement member laminated on another surface of the base film and situated at least at a position opposite the terminal connecting area, wherein the shape of an end edge of the reinforcement member on the same side as an opposite end edge of the conductive pattern includes a periodic form constituted by curved lines.

MODE FOR CARRYING OUT THE INVENTION

Figure 1:
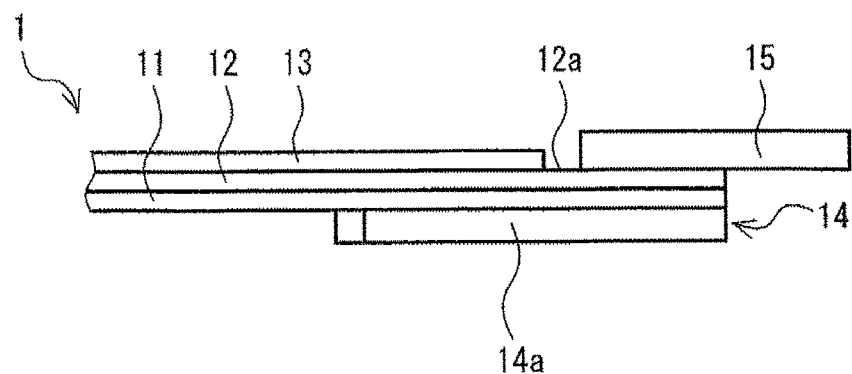
FIG. 1 is a schematic side elevation view of a flexible printed circuit board according to one aspect of the present invention.

[Problem to be Solved by the Invention]

In a flexible printed circuit board reinforced by a reinforcement member, stress is likely to be concentrated on the boundary between the place where the reinforcement member is laminated and the place where the reinforcement member is not laminated. Fracture is thus likely to occur at this boundary.

Particularly noted is the fact that, with recent progress in the size reduction of electronic devices, the conductive patterns of flexible printed circuit boards have become narrower and narrower, and, also, the bending radius of flexible printed circuit boards has become smaller and smaller. Because of this, a fracture in the conductive patterns of flexible printed circuit boards resulting from stress concentration has become a larger problem.

Diligent study conducted by the inventors with respect to stress concentration caused by the reinforcement member has revealed that stress is readily concentrated when the end edge of the reinforcement member situated at the border between the portion having the laminated reinforcement member and the portion lacking such laminated reinforcement member is in the form of a straight line.

The present invention is made in consideration of the above-noted circumstances, and is directed to providing a flexible printed circuit board that can prevent fractures caused by stress concentration resulting from the presence of a reinforcement member.

[Advantage of the Invention]

The flexible printed circuit board of the present invention prevents fractures caused by stress concentration resulting from the presence of a reinforcement member.

Description of Embodiments

A flexible printed circuit board according to one aspect of the present invention made in order to solve the above-noted problems includes a base film having an insulating property and a conductive pattern laminated on one surface of the base film, and has a terminal connecting area toward one end edge of the conductive pattern, the flexible printed circuit board including a reinforcement member laminated on the opposite surface of the base film and situated at least at a position opposite the terminal connecting area, wherein a shape of an end edge of the reinforcement member on the same side as an opposite end edge of the conductive pattern includes a periodic form constituted by curved lines.

The flexible printed circuit board is such that the shape of the end edge of the reinforcement member on the same side as the opposite end edge of the conductive pattern includes a periodic form constituted by curved lines. With this curved and periodic modulation of the end edge of the reinforcement member, the flexible printed circuit board is gradually strengthened toward the above-noted one end edge at the position of the end edge of the reinforcement member. Strengthening the flexible printed circuit board gradually toward the one end edge makes it easier to disperse stress, so that such a flexible printed circuit board can prevent fractures caused by stress concentration resulting from the presence of a reinforcement member.

The flexible printed circuit board may be such that the periodic form is an undulating form. Use of the periodic form that is an undulating form serves to disperse stress more effectively, thereby improving the fracture preventive effect of the flexible printed circuit board.

The flexible printed circuit board may be such that the reinforcement member includes a plurality of reinforcement layers, and end edges of at least two or more layers, among the reinforcement layers, on the same side as the noted opposite end edge are at different positions, and the end edges include the periodic form. Placing a plurality of periodic forms at different positions for the reinforcement member serves to disperse stress further, thereby improving the fracture preventive effect of the flexible printed circuit board.

The flexible printed circuit board may include a coverlay laminated on the one surface of the base film or the conductive pattern, except on the terminal connecting area, and an end edge of the coverlay on the same side as the noted one end edge may not overlap, in a plan view, the end edges of the reinforcement layers having the periodic form on the same side as the noted opposite end edge. In this manner, ensuring that the noted end edge of the coverlay and the noted end edges of the reinforcement layers do not overlap in a plan view allows stress to be more effectively dispersed, thereby improving the fracture preventive effect of the flexible printed circuit board.

The flexible printed circuit board may include one or more connection terminals on the terminal connecting area, and the connection terminals may be made of a metal. The effect to prevent stress concentration is particularly notable with respect to flexible printed circuit boards connected with metal connection terminals that have high stiffness.

Details of Embodiments of the Present Invention

In the following, embodiments of the flexible printed circuit board according to the present invention will be described with reference to the drawings.

First Embodiment

Figure 2:
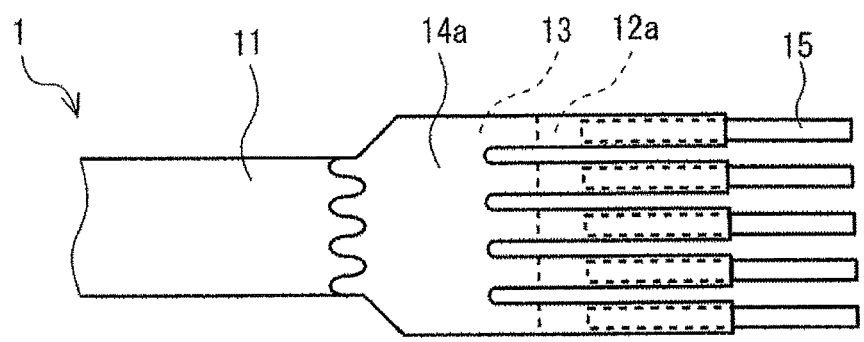
FIG. 2 is a schematic back view of the flexible printed circuit board of FIG. 1.

The flexible printed circuit board 1 according to one aspect of the present invention illustrated in FIG. 1 and FIG. 2 includes a base film 11 having an insulating property, a conductive pattern 12 laminated on one surface of the base film 11, a coverlay 13 laminated on the one surface of the base film 11 or conductive pattern 12, and a reinforcement member 14 laminated on the opposite surface of the base film 11. The flexible printed circuit board 1 has a terminal connecting area 12a on and toward one end edge of the conductive pattern 12, and has a plurality of connection terminals 15 on the terminal connecting area 12a.
<Base Film>

The base film 11 is a member that supports the conductive pattern 12, and is a structural material that secures the strength of the flexible printed circuit board 1.

The main component of the base film 11 may be a soft material such as polyimide, liquid crystal polymer such as liquid crystal polyester, polyethylene terephthalate, polyethylene naphthalate, polyphenylene ether, or fluorine resin, a hard material such as paper phenol, paper epoxy, a glass composite, glass epoxy, or a glass substrate, or a rigid flexible material composed of a soft material and a rigid material. Among these, polyimide is preferable due to its excellent heat resistance. The base film 11 may be porous, or may include fillers, additives, and the like.

Although the base film 11 is not limited to a particular thickness, the lower limit of the average thickness of the base film 11 is preferably 5 μm and more preferably 12 μm. The upper limit of the average thickness of the base film 11 is preferably 500 μm and more preferably 200 μm. The average thickness of the base film 11 less than the lower limit may create a risk that the strength of the base film 11 is insufficient. Alternatively, the average thickness of the base film 11 exceeding the upper limit may create a risk that the flexibility of the flexible printed circuit board 1 is insufficient.
<Conductive Pattern>

The conductive pattern 12 constitutes structures such as an electrical interconnect structure, the ground, shields, and the like.

The conductive pattern 12 is not limited to a particular material as long as the material has electrical conductivity. Examples include metals such as copper, aluminum, and nickel. In general, copper is used due to its relatively low price and high conductivity. The conductive pattern 12 may also be plated on the surface thereof.

The lower limit of the average thickness of the conductive pattern 12 is preferably 2 μm and more preferably 5 μm. Further, the upper limit of the average thickness of the conductive pattern 12 is preferably 100 μm and more preferably 70 μm. In the case of the average thickness of the conductive pattern 12 being less than the lower limit, there may be a risk that the conductivity of the conductive pattern 12 is insufficient. Conversely, in the case of the average thickness of the conductive pattern 12 exceeding the upper limit, there may be a risk that the flexible printed circuit board 1 is needlessly thick.

The terminal connecting area 12a of the flexible printed circuit board 1 situated toward the one end edge of the conductive pattern 12 is an area used to connect with another electronic device through the connection terminals 15, which will be described later. In the terminal connecting area 12a, the coverlay 13, which will be described later, is nonexistent.

The terminal connecting area 12a has a comb shape with the teeth extending toward the one end edge as illustrated in FIG. 2. Each tooth portion of the comb is provided with one connection terminal 15. As described above, the shape of the flexible printed circuit board 1 at the above-noted terminal connecting area 12a may be configured into a comb shape, which makes it less likely that stress applied to the terminal connecting area 12a by any given connection terminal 15 will be applied to the terminal connecting area 12a of adjacent connection terminals 15. This reduces stress applied through the connection terminals 15 to the flexible printed circuit board 1.

The size of each tooth portion of the terminal connecting area 12a is determined by the size of the connection terminals 15, and may have an average width of 0.5 mm or more and 3 mm or less and an average length of 3 mm or more and 50 mm or less. The number of tooth portions is determined in accordance with the number of connection terminals 15. Normally, the width of the base film 11 including the terminal connecting area 12a is constant. Depending on the number of connection terminals 15, however, the circumstance may require a larger width than the width of that part of the base film 11 which is other than the above-noted terminal connecting area 12a. In such a case, as illustrated in FIG. 2, for example, the required number of tooth portions is secured by widening the base film 11 toward the one end edge.
<Coverlay>

The coverlay 13 protects the conductive pattern 12 from external forces, moisture, and the like. The coverlay 13 includes a cover film and an adhesive layer. The coverlay 13 is implemented as the cover film laminated through this adhesive layer to the opposite surface of the conductive pattern 12 from the base film 11.

(Cover Film)

The cover film is not limited to a particular material, and the same or similar material as a resin constituting the base film 11 may be used, for example.

The lower limit of the average thickness of the cover film is preferably 5 μm and more preferably 10 μm. Further, the upper limit of the average thickness of the cover film is preferably 50 μm and more preferably 30 μm. An average thickness of the cover film less than the lower limit may create a risk of insufficient insulation. Conversely, the average thickness of the cover film exceeding the upper limit may create a risk that the flexibility of the flexible printed circuit board 1 is undermined.

(Adhesive Layer)

The adhesive layer serves to secure the cover film on the conductive pattern 12 and on the base film 11. The adhesive layer is not limited to a particular material as long as the material is capable of securing the cover film on the conductive pattern 12 and on the base film 11. Excellent flexibility and excellent heat resistance are preferable properties, and examples include polyimide, polyamide, epoxy, butyral, acrylic, and the like. Further, a thermosetting resin is preferable in terms of heat resistance.

Although the adhesive layer of the coverlay 13 is not limited to a particular average thickness, the lower limit of the average thickness of the adhesive layer is preferably 5 μm and more preferably 10 μm, for example. Further, the upper limit of the average thickness of the adhesive layer is 100 μm and more preferably 80 μm, for example. An average thickness of the adhesive layer less than the lower limit may create a risk of insufficient adhesion. Conversely, the average thickness of the adhesive layer exceeding the upper limit may create a risk that the flexibility of the flexible printed circuit board 1 is undermined.

<Reinforcement Member>

The reinforcement member 14 is laminated on the opposite surface of the base film 11 and situated at least at a position opposite the terminal connecting area 12a. The reinforcement member 14 is constituted by a reinforcement plate 14a. The shape of the end edge of the reinforcement member 14, i.e., the end edge on the same side as the opposite end edge of the conductive pattern 12, is a periodic pattern constituted by curved lines, which is, to be more specific, an undulating form. Use of the periodic form that is an undulating form serves to disperse stress more effectively, thereby improving the fracture preventive effect.

The reinforcement member 14 is made of a material having excellent mechanical strength. A material having a resin as a main component may be especially suitable as the material of the reinforcement member 14. The use of the reinforcement member 14 having a resin as a main component enables the reinforcement of the flexible printed circuit board 1 while securing flexibility. Examples of the above-noted resin include epoxy resin, polyester, polyimide, and the like. Further, as the material of the reinforcement member 14, a resin reinforced with glass fibers or paper such as a glass epoxy resin may be used. Herein, the term "main component" refers to a component accounting for the highest content, and refers to a component with a content of 50 wt % or more.

The end edge of the reinforcement plate 14a constituting the reinforcement member 14 which is the end edge on the same side as the noted opposite end edge may not overlap, in a plan view, the end edge of the coverlay 13 on the same side as the noted one end edge. The end edge of the reinforcement plate 14a on the same side as the noted opposite end edge is preferably situated further toward the direction of the opposite end edge than is the end edge of the coverlay 13 on the same side as the one end edge. In this manner, provision is made such that the end edge of the reinforcement plate 14a on the same side as the noted opposite end edge is situated further toward the direction of the opposite end edge than is the end edge of the coverlay 13 on the same side as the one end edge, thereby more reliably protecting the portion that is likely to receive stress.

The lower limit of the average thickness (i.e., the average thickness of the reinforcement plate 14a) is preferably 5 μm and more preferably 15 μm. Further, the upper limit of the average thickness of the reinforcement member 14 is preferably 500 μm and more preferably 400 μm. An average thickness of the reinforcement member 14 less than the above-noted lower limit results in the failure to provide a sufficient reinforcement effect, thereby creating a risk that the flexible printed circuit board 1 is likely to exhibit bending and/or warpage. Conversely, the average thickness of the reinforcement member 14 exceeding the upper limit creates a risk that the flexible printed circuit board 1 is needlessly thick.

As was previously described, the shape of the end edge of the reinforcement plate 14a on the same side as the noted opposite end edge is a periodic form. The lower limit of the period of the end edge shape is preferably 0.2 mm and more preferably 0.5 mm. Further, the upper limit of the period of the end edge shape is preferably 2 mm and more preferably 1.5 mm. The period of the end edge shape less than the noted lower limit results in the shape being an elongated shape, thereby creating a risk that the end edge portion of the reinforcement member 14 is easily broken. Conversely, the period exceeding the noted upper limit creates a risk of an insufficient fracture preventive effect.

The number of repetitions of the periodic form may be determined in response to the average width or the like of the flexible printed circuit board 1. The number may preferably be determined such that a value obtained by dividing the stress, applied to the flexible printed circuit board 1 during actual use, by the number of repetitions is less than or equal to 200 N/period, or may more preferably be determined such that such a value is less than or equal to 100 N/period. Determining the number of repetitions in this manner serves to disperse stress more effectively, thereby making it possible to reduce breakage at the end edge portion of the reinforcement member 14 while improving the fracture preventive effect.

As was previously described, the shape of the end edge of the reinforcement plate 14a on the same side as the noted opposite end edge is an undulating form. The lower limit of a wave height of the undulating form (i.e., an average amplitude of the undulating form) is preferably 0.2 mm and more preferably 0.5 mm. Further, the upper limit of a wave height of the undulating form is preferably 2 mm and more preferably 1.5 mm. A wave height of the undulating form less than the noted lower limit creates a risk of an insufficient fracture preventive effect. Conversely, a wave height of the undulating form exceeding the noted upper limit results in the undulating form being an elongated form, thereby creating a risk that the end edge portion of the reinforcement member 14 is easily broken.

The phase of the wave form illustrated in FIG. 2 is such that the wave has a midpoint of the wave at one end of the end edge of the reinforcement member 14 and has a next peak extending toward the noted opposite end edge. Nonetheless, the phase of the wave form may be any phase, without being limited to a particular phase. It may be noted that the phase illustrated in FIG. 2 is preferable from the viewpoint of reducing breakage at the end edge portion of the reinforcement member 14.

Contact between the reinforcement plate 14a and the base film 11 may be secured through an adhesive layer, for example. In the case of securing the reinforcement plate 14a with an adhesive layer, the adhesive layer is not limited to a particular material as long as the material is capable of securing the reinforcement plate 14a. The same or similar material as the one used for securing the cover film may be used. The lower limit of the average thickness of the adhesive layer is preferably 5 μm and more preferably 10 μm. Further, the upper limit of the average thickness of the adhesive layer is preferably 100 μm and more preferably 70 μm. An average thickness of the adhesive layer less than the lower limit may create a risk of insufficient adhesion with respect to the reinforcement member 14. Conversely, the average thickness of the adhesive layer exceeding the upper limit creates a risk that the flexible printed circuit board 1 is needlessly thick.

<Connection Terminal>

The connection terminal 15 is a component for connecting the flexible printed circuit board 1 with another electronic device or the like.

The connection terminals 15 are not limited to a particular material as long as the material is electrically conductive. It may suffice for the connection terminals 15 to be made of a metal. The effect to prevent stress concentration is particularly high with respect to the flexible printed circuit board 1 connected with the high-stiffness connection terminals 15 made of a metal. Examples of the above-noted metal include soft copper, brass, phosphor bronze, and the like. The surface of the connection terminals 15 is preferably plated to prevent oxidation. The above-described plating may be Sn plating, Ni plating, Au plating, or the like. Among these, Ni plating, which is inexpensive and exhibits excellent corrosion resistance, is preferable.

The shape of the above-described connection terminals 15 is determined in accordance with the shape of the terminal of the electronic device or the like that is to be coupled. The shape may be a plate shape or molded three dimensional shape having an average width of 0.5 mm to 3 mm inclusive, an average length of 3 mm to 50 mm inclusive, and an average height of 0.1 mm to 3 mm inclusive.

The connection terminals 15 are mounted on the terminal connecting area 12a to be electrically connected to the conductive pattern 12.

<Method of Making Flexible Printed Circuit Board>

The flexible printed circuit board 1 may be made by a production method that includes a step of forming a flexible printed circuit board core, a step of forming a reinforcement member, and a step of mounting connection terminals.

(Step of Forming Flexible Printed Circuit Board Core)

A flexible printed circuit board core is formed that includes a base film 11 having an insulating property, a conductive pattern 12 laminated on one surface of the base film 11, and a coverlay 13 laminated on the one surface of the base film 11 or the conductive pattern 12. The specific procedure is as follows.

A conductive layer is formed on one surface of the base film 11.

The conductor layer may be formed by bonding a conductor foil with an adhesive or by a deposition method known in the art, for example. Examples of the conductor include copper, silver, gold, nickel, and the like. The adhesive is not limited to any particular adhesive as long as the adhesive is capable bonding the conductor to the base film 11, and various adhesives known in the art may be used. Examples of the deposition method include vapor deposition, plating, and the like. The conductor layer is preferably formed by bonding a copper foil to the base film 11 through a polyimide adhesive.

The conductive layer is then patterned to form a conductive pattern 12.

Patterning of the conductor layer may be performed by methods known in the art, such as photoetching. Photoetching is performed by forming a resist film with a predetermined pattern on one surface of the conductive layer, by subsequently treating the conductive layer exposed from the resist film with an etchant, and by removing the resist film.

Finally, the coverlay 13 is laminated to cover the conductive pattern 12, except for the terminal connecting area 12a situated on the same side as the one end edge of the conductive pattern 12. Specifically, an adhesive layer is laminated on the surface of the base film 11 having the conductive pattern 12 formed thereon, and a cover film is laminated on the adhesive layer. Alternatively, an adhesive layer may be pre-laminated on the cover film, and the surface of the cover film having the adhesive layer laminated thereon is placed in contact with, and bonded to, the conductive pattern 12.

Bonding of the cover film with an adhesive is typically effected by thermal compression bonding. The temperature and pressure at the time of thermal compression bonding may be determined depending on the type and composition of the adhesive used. This thermal compression bonding may be performed together with the thermal compression bonding of the reinforcement member 14 performed in the step of forming the reinforcement member which will be described below.

(Step of Forming Reinforcement Member)

In the step of forming a reinforcement member, a reinforcement member 14 is laminated on the opposite surface of the base film 11 of the flexible printed circuit board core. The reinforcement member of the flexible printed circuit board 1 is constituted by the reinforcement plate 14a.

The end edge of the reinforcement plate 14a, i.e., the end edge to be placed on the same side as the opposite end edge of the conductive pattern 12 upon lamination, is pre-fabricated into a wave shape. The above-noted fabrication method is not limited to a particular method, and may, for example, involve punching based on a press mold.

The fabricated reinforcement plate 14a is laminated on the opposite surface of the base film 11. The method of lamination may involve disposing an adhesive layer on the surface of the reinforcement plate 14a, for example, and laminating the reinforcement plate 14a on the opposite surface of the base film 11 via the adhesive layer. The reinforcement plate 14a is then thermally bonded by pressure and heat This thermal compression bonding may be utilized to perform the thermal compression bonding of the coverlay 13 at the same time.

(Step of Mounting Connection Terminals)

In the step of mounting the connection terminals, the connection terminals 15 are mounted on the terminal connecting area 12a. The method of mounting the connection terminals 15 is not limited to a particular method as long as the connection terminals 15 are secured on the terminal connecting area 12a with electrical conduction enabled therebetween. For example, the employed method may involve disposing solders on the terminal connecting area 12a of the conductive pattern 12, placing the ends of the connection terminals 15 on the solder, and melting the solder for reflow soldering to solder the connection terminals 15 to the conductive pattern 12, or may involve swaging the base film 11 for each connection terminal 15 for connection, or may involve pressing the connection terminals 15 from above for compression bonding to the terminal connecting area 12a while establishing electrical connection. Through such means, the connection terminals 15 are mounted, so that the flexible printed circuit board 1 is made.

<Advantage>

The flexible printed circuit board 1 is such that the shape of the end edge of the reinforcement member 14 on the same side as the opposite end edge of the conductive pattern 12 is a periodic form constituted by curved lines. With this curved and periodic modulation of the end edge of the reinforcement member 14, the flexible printed circuit board 1 is gradually strengthened toward the above-noted one end edge at the position of the end edge of the reinforcement member 14. Strengthening the flexible printed circuit board 1 gradually toward the one end edge makes it easier to disperse stress, so that the flexible printed circuit board 1 can prevent fractures caused by stress concentration resulting from the presence of the reinforcement member 14.

Second Embodiment

Figure 3:
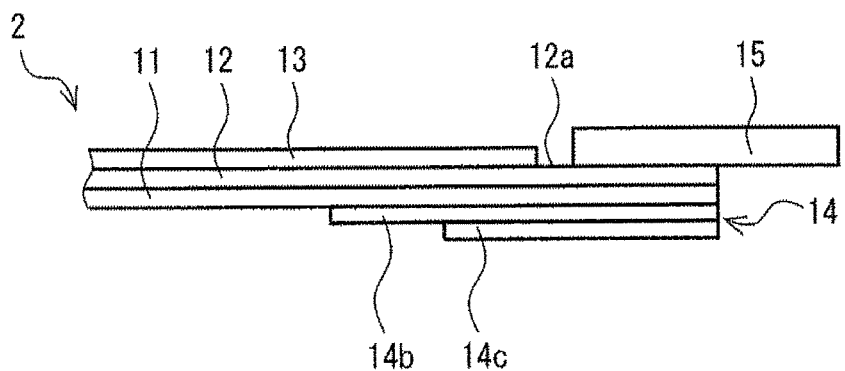
FIG. 3 is a schematic side elevation view of a flexible printed circuit board according to an aspect different from FIG. 1.
Figure 4:
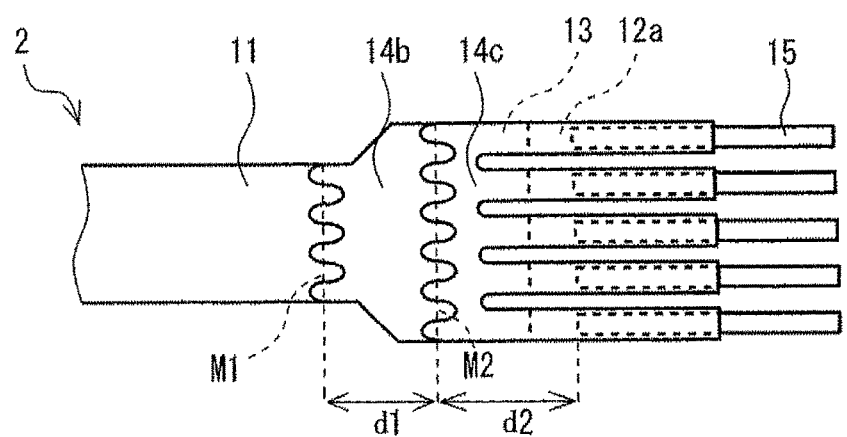
FIG. 4 is a schematic back view of the flexible printed circuit board of FIG. 3.

A flexible printed circuit board 2 according to a different aspect of the present invention illustrated in FIG. 3 and FIG. 4, which is different from the one illustrated in FIG. 1, includes a base film 11 having an insulating property, a conductive pattern 12 laminated on one surface of the base film 11, a coverlay 13 laminated on the one surface of the base film 11 or conductive pattern 12, and a reinforcement member 14 laminated on the opposite surface of the base film 11. The flexible printed circuit board 1 has a terminal connecting area 12a on and toward one end edge of the conductive pattern 12, and has a plurality of connection terminals 15 on the terminal connecting area 12a.

The configuration of the base film 11, the conductive pattern 12, the coverlay 13, and the connection terminals 15 for the flexible printed circuit board 2 of FIG. 3 may be the same as or similar to the configuration of the base film 11, the conductive pattern 12, the coverlay 13, and the connection terminals 15 for the flexible printed circuit board 1 of FIG. 1, respectively. In consideration of the above, the duplicate descriptions of the flexible printed circuit board 2 illustrated in FIG. 3 which overlap the descriptions of the flexible printed circuit board 1 of FIG. 1 will omitted. In the following, a description will be given with respect to the reinforcement member 14 having a different configuration and with respect to the method of making the flexible printed circuit board 2.

<Reinforcement Member>

The reinforcement member 14 is laminated on the opposite surface of the base film 11 and situated at least at a position opposite the terminal connecting area 12a. With respect to the flexible printed circuit board 2 illustrated in FIG. 3, the reinforcement member 14 is comprised of two reinforcement layers, i.e., an inner layer 14b laminated on the opposite surface of the base film 11 and an outer layer 14c laminated on the surface of the inner layer 14b opposite the base film 11. The shape of the end edges of the inner layer 14b and the outer layer 14c, i.e., the end edges on the same side as the opposite end edge of the conductive pattern 12, is a periodic pattern constituted by curved lines, which is, to be more specific, an undulating form. Use of the periodic form that is an undulating form serves to disperse stress more effectively, thereby improving the fracture preventive effect.

The material of the reinforcement member 14 may be the same as or similar to that of the flexible printed circuit board 1 of FIG. 1.

End edges of the inner layer 14b and the outer layer 14c situated on the same side as the above-noted one end edge coincide with the end edge of the base film 11 situated on the same side as the noted one end edge. The average length of the inner layer 14b is greater than the average length of the outer layer 14c. The end edge of the outer layer 14c situated on the same side as the opposite end edge of the conductive pattern 12 is positioned closer to the noted one end edge than is the end edge of the inner layer 14b situated on the same side as the noted opposite end edge. Namely, with respect to the two layers, i.e., the inner layer 14b and the outer layer 14c, the end edges of the reinforcement layers on the same side as the noted opposite end edge are situated at different positions.

Further, the respective end edges of the inner layer 14b and the outer layer 14c on the same side as the noted opposite end edge may not overlap, in a plan view, the end edge of the coverlay 13 situated on the same side as the noted one end edge. In this manner, ensuring that the noted end edge of the coverlay and the noted end edges of the reinforcement layers do not overlap in a plan view allows stress to be more effectively dispersed, thereby improving a fracture preventive effect.

The end edge of the outer layer 14c situated toward the noted opposite end edge may be situated further toward the opposite end edge than is the end edges of the connection terminals 15 situated toward the opposite end edge. Further, the end edge of the outer layer 14c situated toward the noted opposite end edge may be situated further toward the opposite end edge than is the end edge of the coverlay 13 situated toward the noted one end edge. Positioning the edge of the outer layer 14c on the same side as the noted opposite end edge in such an arrangement serves to more reliably protect the portion that is likely to receive stress.

The average thickness of the laminated portion of the reinforcement member 14 (i.e., the average thickness of the portion made by laminating the inner layer 14b and the outer layer 14c) may be set substantially equal to the average thickness of the reinforcement member 14 of the flexible printed circuit board 1 illustrated in FIG. 1 (i.e., the average thickness of the reinforcement plate 14a).

Further, the average thickness of the inner layer 14b and the average thickness of the outer layer 14c are preferably equal. Making the average thickness of the inner layer 14b equal to the average thickness of the outer layer 14c serves to disperse stress more effectively, thereby improving a fracture preventive effect.

The lower limit of an average separation distance d1 between the end edge of the inner layer 14b situated toward the noted opposite end edge and the end edge of the outer layer 14c situated toward the noted opposite end edge is preferably 1 mm and more preferably 3 mm. Further, the upper limit of the average separation distance d1 is preferably 20 mm and more preferably 12 mm. The average separation distance d1 less than the above-noted lower limit creates a risk that stress is not sufficiently dispersed, which fails to provide a sufficient fracture preventive effect. Conversely, the average separation distance d1 exceeding the above-noted upper limit makes it difficult to place the periodic-form end edges of the inner layer 14b and the outer layer 14c properly at the position on which stress is likely to be concentrated, thereby creating a risk of an insufficient fracture preventive effect. It may be noted that the end edge of the inner layer 14b situated toward the noted opposite end edge and the end edge of the outer layer 14c situated toward the noted opposite end edge are both an undulating form. With these end edges, the average separation distance d1 therebetween refers to the distance between the midpoint lines (i.e., the distance between M1 and M2 in FIG. 4), which are situated toward the noted opposite end edges.

The lower limit of an average separation distance d2 between the end edge of the outer layer 14c situated toward the noted opposite end edge and the end edges of the connection terminals 15 situated toward the noted opposite end edge is preferably 1 mm and more preferably 3 mm. Further, the upper limit of the average separation distance d2 is preferably 20 mm and more preferably 12 mm. The average separation distance d2 less than the above-noted lower limit makes it difficult to place the periodic-form end edges of the inner layer 14b and the outer layer 14c properly at the position on which stress is likely to be concentrated, thereby creating a risk of an insufficient fracture preventive effect. Conversely, the average separation distance d2 exceeding the above-noted upper limit creates a risk that stress is not sufficiently dispersed, which fails to provide a sufficient improvement to the fracture preventive effect. It may be noted that the average separation distance d1 between the end edge of the inner layer 14b toward the noted opposite end edge and the end edge of the outer layer 14c toward the noted opposite end edge is preferably equal to the average separation distance d2 between the end edge of the outer layer 14c toward the noted opposite end edge and the end edges of the connection terminals 15 toward the noted opposite end edge.

The shape of the end edges of the inner layer 14b and the outer layer 14c situated toward the noted opposite end edge may be the same as or similar to the shape of the end edge of the reinforcement plate 14a situated toward the noted opposite end edge in the flexible printed circuit board 1 of FIG. 2. The period and wave height of the wave-shaped form of the inner layer 14b and the outer layer 14c are preferably equal to each other from the viewpoint of ensuring even dispersion of stress.

Contact between the inner layer 14b and the base film 11 and contact between the outer layer 14c and the inner layer 14b may be secured by an adhesive layer, for example. In the case of the inner layer 14b and the outer layer 14c being secured through the adhesive layer, the material and average thickness of the adhesive layer may be the same as or similar to those of the adhesive layer in the case of the adhesive layer being used to secure the reinforcement plate 14a of the flexible printed circuit board 1 illustrated in FIG. 1.

<Method of Making Flexible Printed Circuit Board>

The flexible printed circuit board 2 may be made by a production method including a step of forming a flexible printed circuit board core, a step of forming a reinforcement member, and a step of mounting connection terminals.

(Step of Forming Flexible Printed Circuit Board Core)

The step of forming a flexible printed circuit board core may be the same as or similar to the step of forming a flexible printed circuit board core in the method of making the flexible printed circuit board 1 of FIG. 1, and a description thereof will be omitted.

(Step of Forming Reinforcement Member)

In the step of forming a reinforcement member, the reinforcement member 14 is laminated on the opposite surface of the base film 11 of the flexible printed circuit board core. The reinforcement member of the flexible printed circuit board 2 is composed of two reinforcement layers including the inner layer 14b and the outer layer 14c, so that the inner layer 14b and the outer layer 14c are sequentially laminated in this order on the opposite surface of the base film 11. The end edges of the inner layer 14b and the outer layer 14c, i.e., the end edges to be placed on the same side as the opposite end edge of the conductive pattern 12 upon lamination, are pre-fabricated into a wave shape. The above-noted fabrication method is not limited to a particular method, and may, for example, involve punching based on a press mold.

The method of laminating the inner layer 14b and the outer layer 14c may involve, for example, forming an adhesive layer on the surface of the inner layer 14b, which is then laminated on the opposite surface of the base film 11 via the adhesive layer. The outer layer 14c may also be laminated on the surface of the inner layer 14b in the same or similar manner as the inner layer 14b. The inner layer 14b and the outer layer 14c are then bonded by pressure and heat. The pressure and heat may be applied once after the outer layer 14c is laminated, or may be applied separately for each of the inner layer 14b and the outer layer 14c. Thermal compression bonding of the coverlay 13 may be performed concurrently therewith.

(Step of Mounting Connection Terminals)

The step of mounting connection terminals may be the same as or similar to the step of forming a flexible printed circuit board core in the method of making the flexible printed circuit board 1 of FIG. 1, and a description thereof will be omitted.

<Advantage>

The flexible printed circuit board 2 is such that the reinforcement member 14 is composed of two reinforcement layers including the inner layer 14b and the outer layer 14c, and the end edges of these two reinforcement layers situated on the same side as the noted opposite end edge are at different positions, and also have the noted periodic form. With respect to the flexible printed circuit board 2, placing a plurality of periodic forms at different positions for the reinforcement member 14 serves to disperse stress further, thereby improving the fracture preventive effect.

Other Embodiments

The embodiments disclosed herein should be regarded in all respects as examples only and as non-limiting. The scope of the present invention is defined by the claims without being limited to the configurations of the disclosed embodiments, and is intended to include all modifications within the spirit and equivalents of the scope of the claims.

The above-described embodiments have been directed to a case in which the entire shape of the end edge of the reinforcement plate situated toward the opposite end edge of the conductive pattern is a periodic form. However, the present invention is also intended to cover a case in which only a part of the shape of the edge is a periodic form. In the case of only a part of the shape of the end edge being a periodic form, the lower limit of a proportion of the periodic-form part in the entire end edge is preferably 50% and more preferably 75%. If a proportion of the periodic-form part in the entire end edge is below the noted lower limit, there is a risk that the fracture preventive effect is insufficient.

Although the above-described embodiments have been directed to a case in which the periodic form is an undulating form, the periodic form is not limited to an undulating form, and may alternatively be another periodic form comprised of curved lines. Examples of such a form may include a shape made by aligning semicircles one after another in the diameter direction. The shape aligned one after another may alternatively be a half or part of an ellipse, or may alternatively be a shape made by an n-order function (n: even number).

The above-described second embodiment has been directed to a case in which the end edges of the inner layer and the outer layer situated on the same side as the opposite end edge of the conductive pattern are both a periodic form. Alternatively, only one of these may be a periodic form, and the present invention is intended to cover such a flexible printed circuit board.

The above-described second embodiment has been directed to a case in which the reinforcement member is constituted by two reinforcement layers. The number of reinforcement layers is not limited to two, and may alternatively be three or more. In view of relationships between the manufacturing cost and the resulting effects, the number of laminated layers is preferably five at the maximum.

When the reinforcement member is constituted by three or more reinforcement layers, it may suffice for at least one layer among these layers to have a periodic-form end edge on the same side as the opposite end edge of the conductive pattern in order to conform to what is intended by the present invention. There are preferably two or more reinforcement layers having the periodic-form end edges, and, more preferably, all the layers are such reinforcement layers.

In the case in which there are three or more reinforcement layers having the periodic-form end edges, average separation distances between adjacent end edges of the reinforcement layers situated toward the opposite end edge of the conductive pattern may be equal to each other. Use of equal average separation distances between the adjacent end edges in this manner may more effectively disperse stress, thereby improving the fracture preventive effect.

Figure 5:
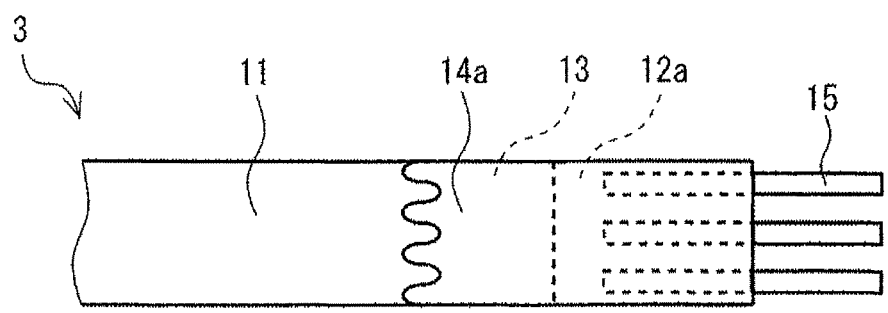
FIG. 5 is a schematic back view of a flexible printed circuit board according to an aspect different from FIG. 2 and FIG. 4.

The above-described embodiment has been directed to a case in which the terminal connecting area has a comb shape, but the shape of the terminal connecting area is not limited to a comb shape. For example, the terminal connecting area 12a may have a rectangular shape in a plan view as in the flexible printed circuit board 3 illustrated in FIG. 5. FIG. illustrates a case in which the width of the terminal connecting area 12a is equal to the width of that part of the base film 11 which is other than the terminal connecting area 12a. In the case in which the area for the connection terminals 15 is insufficient, for example, the width of the base film 11 on the one end edge may be expanded as in the case of the flexible printed circuit board 1 illustrated in FIG. 2.

Although the above-noted embodiments have been directed to a case in which a flexible printed circuit board is provided with a coverlay, the coverlay is not an essential component and may be omitted. Alternatively, an insulating layer of another configuration may be used to coat one surface of the base film or the conductive pattern, for example.

Although the above-noted embodiments have been directed to as case in which a flexible printed circuit board is provided with connection terminals, the connection terminals are not an essential component and may be omitted. A flexible printed circuit board having no connection terminals may be directly bonded to another flexible printed circuit board for connection to another electronic device, for example.

DESCRIPTION OF REFERENCE SYMBOLS 1, 2, 3 flexible printed circuit board
11 base film
12 conductive pattern
12a terminal connecting area
13 coverlay
14 reinforcement member
14a reinforcement plate
14b inner layer
14c outer layer
15 connection terminals
M1, M2 midpoint lines on the opposite-end-edge side of reinforcement layers
d1 average separation distance between the end edge of an inner layer toward the opposite end edge and the end edge of an outer layer toward the opposite end edge
d2 average separation distance between the end edge of an inner layer toward the opposite end edge and the end edge of an outer layer toward the opposite end edge

The invention claimed is:

1. A flexible printed circuit board which includes a base film having an insulating property and a conductive pattern laminated on one surface of the base film, and has a terminal connecting area toward one end edge of the conductive pattern, the flexible printed circuit board comprising:
a reinforcement member laminated on another surface of the base film and situated at least at a position opposite the terminal connecting area, and
connection terminals made of a metal and mounted on the terminal connecting area to be electrically connected to the conductive pattern, the connection terminals being separate from each other,
wherein a shape of an end edge of the reinforcement member on a same side as an opposite end edge of the conductive pattern includes a periodic form constituted by curved lines, the periodic form being an undulating form,
wherein a period of the periodic form is greater than or equal to 0.5 mm, and a wave height of the undulating form is greater than or equal to 0.5 mm, and
wherein the terminal connecting area toward the one end edge has a comb shape with a plurality of teeth portions into which the base film is divided, each one of the teeth portions being provided with a corresponding one of the connection terminals mounted thereon.

2. The flexible printed circuit board as claimed in claim 1, wherein the reinforcement member includes a plurality of reinforcement layers, and
end edges of at least two or more layers, among the reinforcement layers, on the same side as the opposite end edge are at different positions, and the end edges include the periodic form.

3. The flexible printed circuit board as claimed in claim 2, further comprising a coverlay laminated on the one surface of the base film or the conductive pattern, except on the terminal connecting area,
and an end edge of the coverlay on a same side as the one end edge does not overlap, in a plan view, the end edges of the reinforcement layers having the periodic form on the same side as the opposite end edge.

* * * * *